(12) United States Patent
Yuki

(10) Patent No.: US 12,446,327 B2
(45) Date of Patent: Oct. 14, 2025

(54) SEMICONDUCTOR DEVICE

(71) Applicant: ROHM CO., LTD., Kyoto (JP)

(72) Inventor: Tadao Yuki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 619 days.

(21) Appl. No.: 17/912,013

(22) PCT Filed: Mar. 24, 2021

(86) PCT No.: PCT/JP2021/012245
§ 371 (c)(1),
(2) Date: Sep. 15, 2022

(87) PCT Pub. No.: WO2021/205879
PCT Pub. Date: Oct. 14, 2021

(65) Prior Publication Data
US 2023/0131034 A1  Apr. 27, 2023

(30) Foreign Application Priority Data
Apr. 8, 2020 (JP) ................. 2020-069913

(51) Int. Cl.
*H10D 89/60* (2025.01)
(52) U.S. Cl.
CPC ......... *H10D 89/911* (2025.01); *H10D 89/611* (2025.01); *H10D 89/814* (2025.01); *H10D 89/921* (2025.01)
(58) Field of Classification Search
CPC .................................................. H10D 89/911
USPC ........................................................ 257/155
See application file for complete search history.

(56) References Cited

U.S. PATENT DOCUMENTS

2003/0141545 A1* 7/2003 Okawa ................ H10D 18/251
257/E27.111
2015/0380546 A1* 12/2015 Komatsu ............... H10D 89/10
257/343

FOREIGN PATENT DOCUMENTS

| EP | 0981157 A2 | 2/2000 |
|---|---|---|
| JP | 2005057138 A | 3/2005 |
| JP | 2017-143127 A | 8/2017 |

OTHER PUBLICATIONS

International Search Report for PCT/JP2021/012245, mailed on Jun. 22, 2021.

(Continued)

*Primary Examiner* — Ajay Arora
(74) *Attorney, Agent, or Firm* — Rabin & Berdo, P.C.

(57) ABSTRACT

A semiconductor device includes a semiconductor layer, a first region of a first conductivity type formed in the semiconductor layer and connected to a ground potential, a second region of a second conductivity type formed in the semiconductor layer, an insulating film formed on the semiconductor layer and covering the first region and the second region, an internal circuit, signal terminal for driving the internal circuit or to be driven by the internal circuit, a first wiring connecting the internal circuit and the signal terminal, a resistance element formed on the insulating film and interposed halfway through the first wiring, the resistance element including a first resistor facing the second region across the insulating film, and a second wiring connected to the first wiring on a side closer to the signal terminal than the resistance element and connecting the first wiring and the second region.

12 Claims, 8 Drawing Sheets

(56) References Cited

OTHER PUBLICATIONS

Written Opinion of the International Searching Authority for PCT/JP2021/012245, mailed on Jun. 22, 2021.
German Office Action dated May 23, 2025, in the counterpart German Patent Application No. 112021002218.0.
Chinese Office Action dated May 1, 2025, in the counterpart Chinese patent application No. 202180027411.8.

* cited by examiner

SEMICONDUCTOR DEVICE

TECHNICAL FIELD

The present disclosure relates to a semiconductor device.

BACKGROUND ART

Examples of literature that provide problems of electrostatic destruction (ESD damages) include Patent Literature 1.

Patent Literature 1 discloses a field effect transistor with an electrostatic protection diode including a first FET and a two-terminal electrostatic protection circuit connected between a first gate and a first source of the first FET, in which the two-terminal electrostatic protection circuit includes a first diode located on a side of reverse biasing caused when a voltage lower than a potential of the first source is applied to the first gate and having a reverse withstand voltage lower than a reverse withstand voltage between the first gate and the first source of the first FET, a second diode located on a side of forward biasing caused when a voltage lower than the potential of the first source is applied to the first gate and connected in reverse series with the first diode, and a resistor connected in series with a diode pair constituted of the first diode and the second diode and formed by using the same channel layer as that of the first FET.

CITATION LIST

Patent Literature

Patent Literature 1: Japanese Patent Application Publication No. 2017-143127

SUMMARY OF INVENTION

Solution to Problem

A semiconductor device according to a preferred embodiment of the present disclosure may include a semiconductor layer, a first region of a first conductivity type formed in the semiconductor layer and connected to a ground potential, a second region of a second conductivity type formed in the semiconductor layer, an insulating film formed on the semiconductor layer and covering the first region and the second region, an internal circuit, a signal terminal for driving the internal circuit or to be driven by the internal circuit, a first wiring connecting the internal circuit and the signal terminal, a resistance element formed on the insulating film and interposed halfway through the first wiring, the resistance element including a first resistor facing the second region across the insulating film, and a second wiring connected to the first wiring on a side closer to the signal terminal than the resistance element and connecting the first wiring and the second region.

DESCRIPTION OF EMBODIMENTS

Preferred Embodiments of the Present Disclosure

Figure 1:
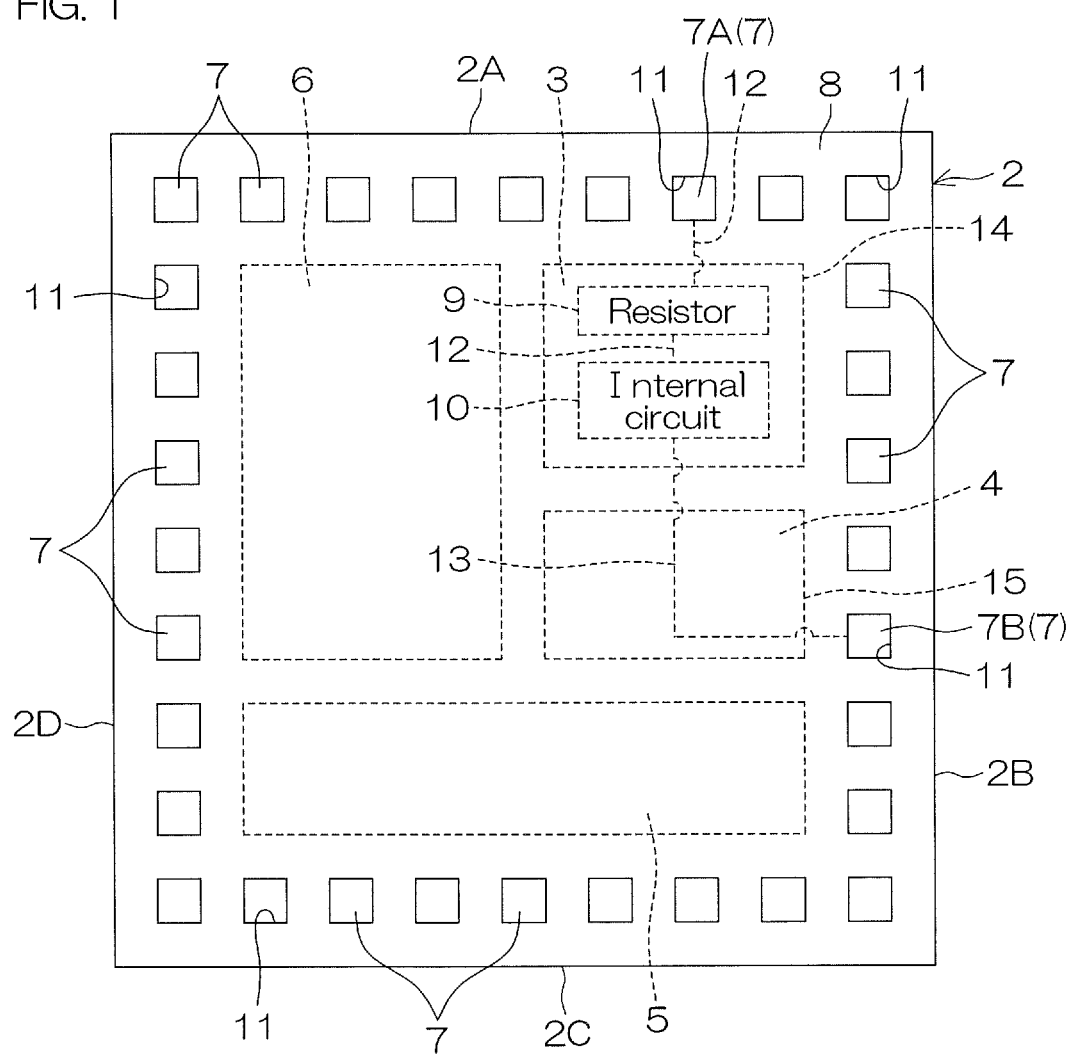
FIG. 1 is a schematic plan view of a semiconductor device according to a preferred embodiment of the present disclosure.

First, preferred embodiments of the present disclosure will be listed and described.

A semiconductor device according to a preferred embodiment of the present disclosure may include a semiconductor layer, a first region of a first conductivity type formed in the semiconductor layer and connected to a ground potential, second region of a second conductivity type formed in the semiconductor layer, an insulating film formed on the semiconductor layer and covering the first region and the second region, an internal circuit, a signal terminal for driving the internal circuit or to be driven by the internal circuit, a first wiring connecting the internal circuit and the signal terminal, a resistance element formed on the insulating film and interposed halfway through the first wiring, the resistance element including a first resistor facing the second region across the insulating film, and a second wiring connected to the first wiring on a side closer to the signal terminal than the resistance element and connecting the first wiring and the second region.

According to this arrangement, the first wiring is electrically branched on the side closer to the signal terminal than the resistance element, and is connected to the second region via the second wiring. Thereby, when the signal terminal is applied with voltage, a potential difference between the first resistor and the second region facing across the insulating film can be made small. In other words, although a slight error caused by a voltage drop due to wiring resistance and the like of the first wiring and the second wiring is expected, the first resistor and the second region can be made almost the same in potential.

Conversely, when the first resistor faces the first region (ground potential), a potential difference between the first resistor and the first region serves as a voltage value of the first resistor with respect to the ground potential. Therefore, when a relatively high voltage is applied to the signal terminal, a large voltage is applied to the insulating film between the first resistor and the first region, which increases the possibility of dielectric breakdown of the insulating film.

In contrast, with a configuration in which the first resistor faces the second region (terminal potential or potential substantially the same as terminal potential), the voltage to be applied to the insulating film can be reduced from the configuration in which the first resistor faces the first region (ground potential). As a result, the possibility of dielectric breakdown of the insulating film can be lowered, so that the semiconductor device can be increased in reliability.

In a semiconductor device according to a preferred embodiment of the present disclosure, the first resistor may include a plurality of first resistors connected in series or in parallel with each other.

According to this arrangement, voltage to be applied to the plurality of first resistors as a whole can be dispersed to each of the first resistors, so that the amount of heat generation in each of the first resistors can be made small. As a result, a temperature rise from the first resistors can be suppressed, and the reliability of the semiconductor device can be increased.

In a semiconductor device according to a preferred embodiment of the present disclosure, the resistance element may include a second resistor formed on a side closer to the internal circuit than the plurality of first resistors and facing the first region across the insulating film.

According to this arrangement, the potential of an end portion of the plurality of first resistors on the internal circuit side is made lower than the terminal potential by a voltage drop due to the plurality of first resistors, and is closer to the ground potential. Here, a first potential difference between the potential (terminal potential or potential substantially the same as terminal potential) of the second region and the potential of an end portion of the first resistor on the internal circuit side is compared with a second potential difference between the potential of the end portion and the potential (ground potential) of the first region. In this case, if the second potential difference is smaller than the first potential difference (second potential difference<first potential difference), by providing the second resistor at a position to face the first region, the possibility of dielectric breakdown of the insulating film on the downstream side from the resistance element (the internal circuit side) can be further lowered.

A semiconductor device according to a preferred embodiment of the present disclosure may further include a ground terminal for providing the ground potential, and a ground wiring connected to the ground terminal.

In a semiconductor device according to a preferred embodiment of the present disclosure, the signal terminal may include a first pad formed on a front surface of the semiconductor device, and the ground terminal may include a second pad formed on the front surface of the semiconductor device.

A semiconductor device according to a preferred embodiment of the present disclosure may further include a protection element connected between the first wiring and the ground wiring.

In a semiconductor device according to a preferred embodiment of the present disclosure, the protection element may include a first protection element connected to the first wiring on a side closer to the signal terminal than a connection portion between the first wiring and the second wiring.

In a semiconductor device according to a preferred embodiment of the present disclosure, the protection element may include a second protection element connected to the first wiring on a side closer to the internal circuit than the resistance element.

In a semiconductor device according to a preferred embodiment of the present disclosure, the resistance element may include a polysilicon resistor.

In a semiconductor device according to a preferred embodiment of the present disclosure, the insulating film may include an oxide film.

In a semiconductor device according to a preferred embodiment of the present disclosure, the second wiring may include a via connected to the second region that penetrates through the insulating film in a thickness direction.

In a semiconductor device according to a preferred embodiment of the present disclosure, the semiconductor layer may include a substrate of the first conductivity type and an epitaxial layer formed on the substrate, and the first region and the second region may be formed in the epitaxial layer.

Detailed Description of Preferred Embodiments of the Present Disclosure

Next, preferred embodiments of the present disclosure shall be described in detail with reference to the attached drawings.

FIG. 1 is a schematic plan view of a semiconductor device 1 according to a preferred embodiment of the present disclosure.

The semiconductor device 1 includes, for example, a semiconductor chip having a quadrilateral shape in a plan view. In this preferred embodiment, the semiconductor device 1 is formed in a rectangular parallelepiped shape. The semiconductor device 1 may be in a square shape as shown in FIG. 1, or may be in a rectangular shape as a planar shape.

The semiconductor device 1 includes a substrate 2 forming an external form thereof, a plurality of circuits 3 to 6 formed on the substrate 2, a plurality of pads 7 electrically connected to the plurality of circuits 3 to 6. A frontmost surface of the substrate 2 is covered with a surface protective film 8 made from, for example, silicon oxide ($SiO_2$).

In this preferred embodiment, the plurality of circuits 3 to 6 include a first circuit 3, a second circuit 4, a third circuit 5, and a fourth circuit 6. The plurality of circuits 3 to 6 may be any of publicly known electronic circuits (digital circuits, analog circuits) including, for example, a switching circuit, a rectifying circuit, a smoothing circuit, a power supply circuit, etc. The plurality of circuits 3 to 6 may include elements formed by using a semiconductor part of the substrate 2, an insulating film formed on the substrate 2, a conductive member (for example, an electrode, wiring, via, etc.) formed on the substrate 2, etc. Examples of such elements include active elements such as a diode, a transistor, etc., and passive elements such as a capacitor, an inductor, a resistor, etc. In this preferred embodiment, the first circuit 3 includes a resistance element 9 and an internal circuit 10.

Further, the plurality of circuits 3 to 6 are, in a plan view, disposed in a central portion of the substrate 2. The plurality of circuits 3 to 6 may occupy the same space as each other in the substrate 2, or may occupy different spaces from each other. Further, the plurality of circuits 3 to 6 may be circuits that are electrically connected to each other, or may be circuits that are electrically separated from each other.

The plurality of pads 7 are exposed from pad openings 11 formed in the surface protective film 8. For example, each part of a plurality of wirings (not shown) exposed from the pad openings 11 may be the pad 7, the plurality of wirings being formed on the substrate 2. The plurality of pads are, in a plan view, formed on a peripheral edge portion of the substrate 2. In this preferred embodiment, the plurality of pads 7 are arrayed along end surfaces of the substrate 2. More specifically, the plurality of pads 7 are arrayed along each of the four end surfaces 2A, 2B, 2C and 2D of the second substrate 2, and as a whole, the plurality of pads 7 are arrayed in a quadrilateral annular shape. The plurality of circuits 3 to 6 are surrounded by the plurality of pads 7.

The plurality of pads 7 may include a first pad 7A and a second pad 7B.

The first pad 7A may be, for example, an input terminal that supplies an input signal to the internal circuit 10. The first pad 7A may be, for example, electrically connected to the resistance element 9 and the internal circuit 10 of the first circuit 3 by a first wiring 12. In the first wiring 12, the resistance element 9 is provided on an upstream side (side closer to the first pad 7A), and the internal circuit 10 is provided on a downstream side (side farther from the first pad 7A).

The second pad 7B may be, for example, a ground terminal that provides a ground potential to the internal circuit 10. The second pad 7B may be, for example, electrically connected to the internal circuit 10 of the first circuit 3 by a ground wiring 13.

In this preferred embodiment, the first pad 7A is disposed closer to the resistance element 9 than the second pad 7B. For example, the distance from a peripheral edge 14 of the area (area enclosed by the broken line in FIG. 1) occupied by the first circuit 3 including the resistance element 9 to the first pad 7A may be shorter than the distance from the peripheral edge 14 of the first circuit 3 to the second pad 7B. In other words, the first pad 7A is provided in a region sandwiched between the peripheral edge 14 of the first circuit and the end surfaces 2A to 2D of the substrate 2 (in this preferred embodiment, the end surface 2A), while the second pad 7B is provided in a region not sandwiched between the peripheral edge 14 of the first circuit 3 and the end surfaces 2A to 2D of the substrate 2 (in this preferred embodiment, a region sandwiched between a peripheral edge 15 of the second circuit 4 and the end surface 2B). Therefore, the ground wiring 13 may be formed in a manner crossing the second circuit 4. Alternatively, the ground wiring 13 may be formed so as to cover the second circuit 4.

Figure 2:
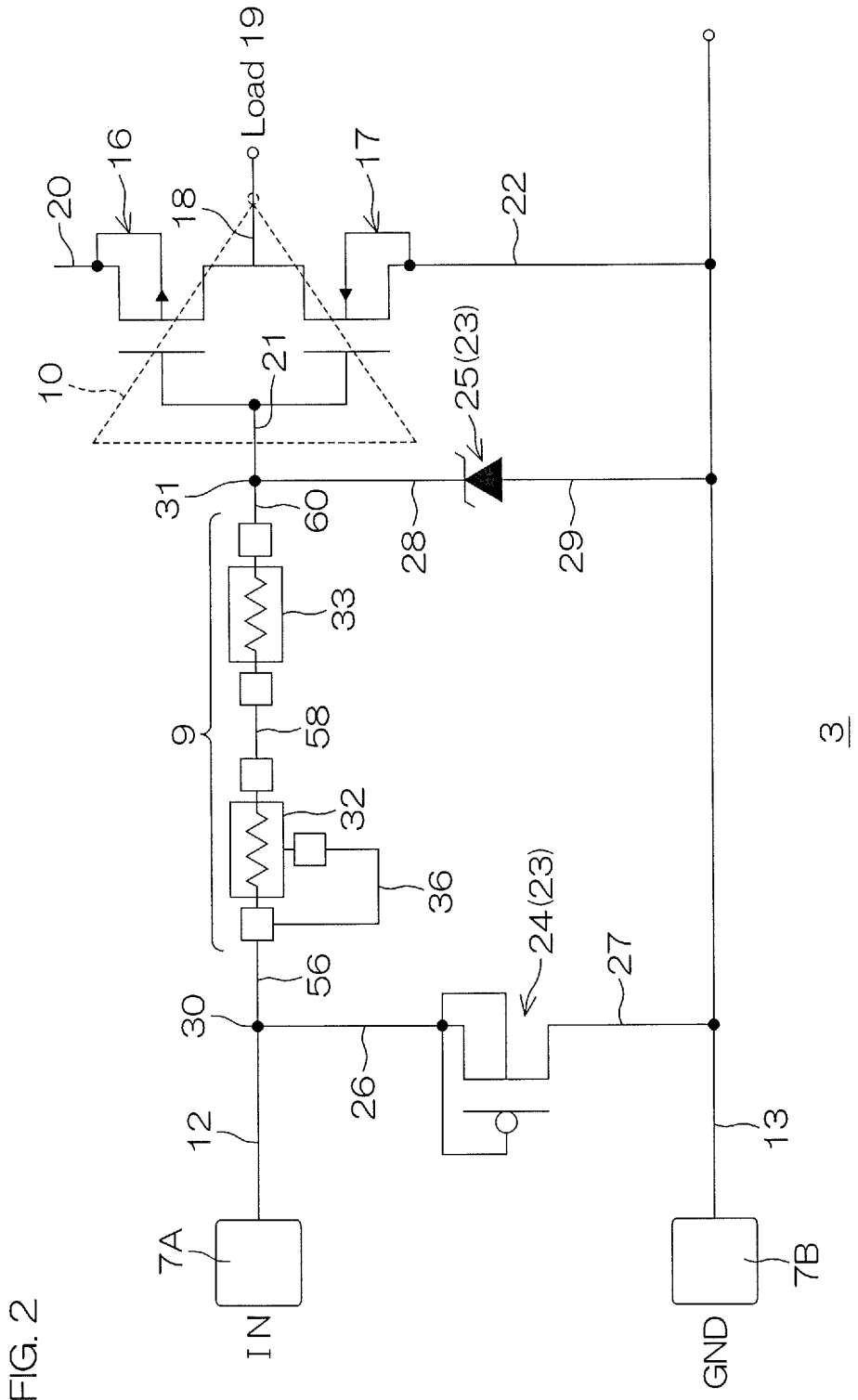
FIG. 2 is a view showing an example of a circuit diagram of the first circuit in FIG. 1.

FIG. 2 is a view showing an example of a circuit diagram of the first circuit 3 in FIG. 1.

Referring to FIG. 2, the first circuit 3 is, for example, a switching circuit that performs inverter control, and has the internal circuit 10. The internal circuit 10 may be, for example, a CMOSFET (Complementary Metal Oxide Semiconductor Field Effect Transistor) that complementarily uses a p-channel MOSFET 16 and an n-channel MOSFET 17.

Drain sides of the p-channel MOSFET 16 and the n-channel MOSFET 17 are connected and provided as an output terminal 18, and the output terminal 18 is connected to a load 19. A source side of the p-channel MOSFET 16 is provided as a Vdd (supply voltage) terminal 20. Further, gates of the p-channel MOSFET 16 and the n-channel MOSFET 17 are provided as a common gate terminal 21 (input terminal). Further, a source side of the n-channel MOSFET 17 is provided as a ground terminal 22 and connected to the ground wiring 13.

The first wiring 12 connects the first pad 7A and the internal circuit 10. More specifically, the first wiring 12 is connected to the gate terminal 21 of the internal circuit 10. A control input signal for determining whether to enable or disable a gate output of the internal circuit 10 is input from the first pad 7A.

The first circuit 3 may further include a protection element 23 connected between the first wiring 12 and the ground wiring 13. The protection element 23 may be referred to, for example, as an ESD (Electro-Static Discharge) protection element which protects the internal circuit 10 from a surge voltage due to static electricity or the like that enters from an external terminal such as the first pad 7A. The protection element 23 may have, for example, a plurality of terminals, and one of the plurality of terminals may be connected to the first wiring 12, and another terminal may be connected to the ground wiring 13.

The protection element 23 may include a protection transistor 24 as an example of a first protection element of the present disclosure and a protection diode 25 as an example of a second protection element of the present disclosure.

In this preferred embodiment, the protection transistor 24 is formed with a p-channel MOSFET. A terminal 26 on the source side of the protection transistor 24 is connected to the first wiring 12, and a terminal 27 on the drain side is connected to the ground wiring 13.

In this preferred embodiment, the protection diode 25 is formed with a constant voltage diode. A terminal 28 on the cathode side of the protection diode 25 is connected to the first wiring 12, and a terminal 29 on the anode side is connected to the ground wiring 13.

Note that the protection element 23 is not limited to the protection transistor 24 and the protection diode 25 shown in FIG. 2, but publicly known protection elements may be used. Further, the number of protection elements 23 also does not need to be two as shown FIG. 2, and may be one or may be three or more. Further, in FIG. 2, since the protection transistor 24 is provided on an upstream side of current (side closer to the pad 7 (external terminal)) than the protection diode 25, the protection transistor 24 may be referred to as a primary protection element (primary clamp) and the protection diode 25 may be referred to as a secondary protection element (secondary clamp).

The resistance element 9 is interposed halfway through the first wiring 12. In this preferred embodiment, the resistance element 9 is provided between a connection portion 30 (first connection portion) between the protection transistor 24 and the first wiring 12 and a connection portion 31 (second connection portion) between the protection diode 25 and the first wiring 12. That is, the resistance element 9 is provided on a downstream side (side closer to the internal circuit 10) from the protection transistor 24. Further, the resistance element 9 is provided on an upstream side (side farther from the internal circuit 10) from the protection diode 25. In this preferred embodiment, the resistance element is provided on the downstream side from the protection transistor 24 and the upstream side from the protection diode 25.

In this preferred embodiment, the resistance element 9 includes a first resistor 32 and a second resistor 33 in order from the upstream side toward the downstream side (from the external terminal toward the internal circuit 10).

Figure 3:
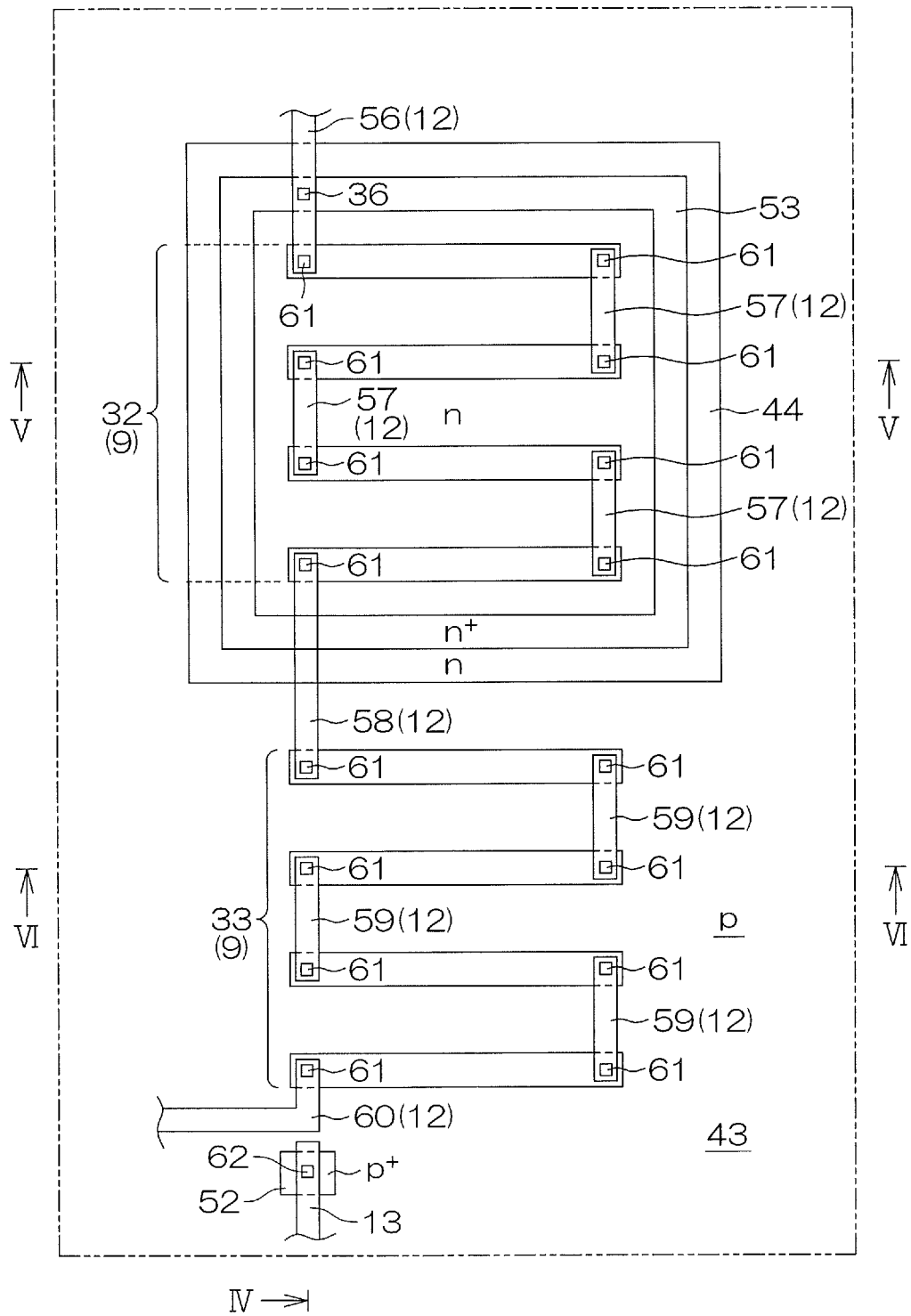
FIG. 3 is a schematic plan view of the resistance element in FIG. 2.
Figure 4:
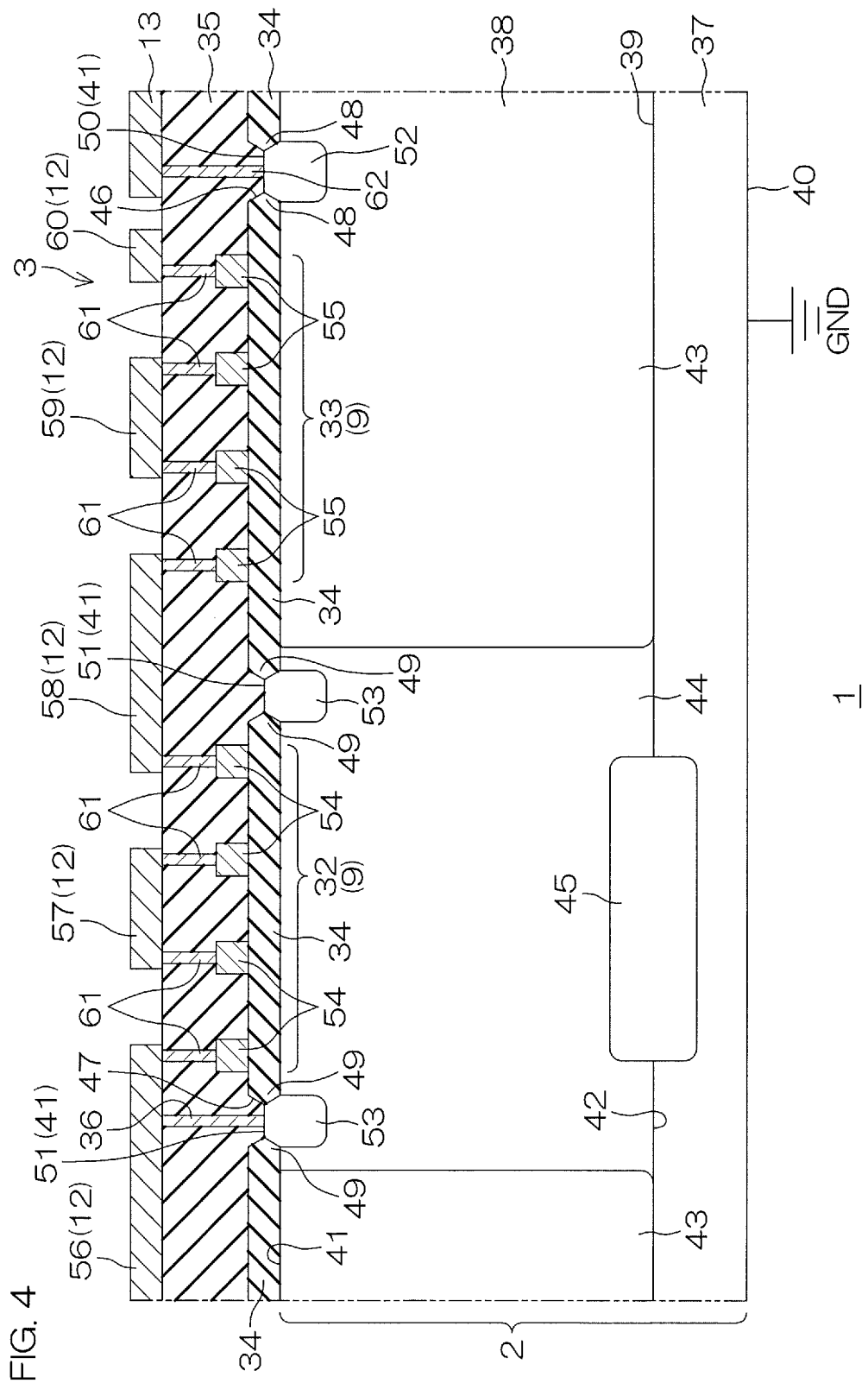
FIG. 4 is a cross-sectional view taken along line in FIG. 3.
Figure 5:
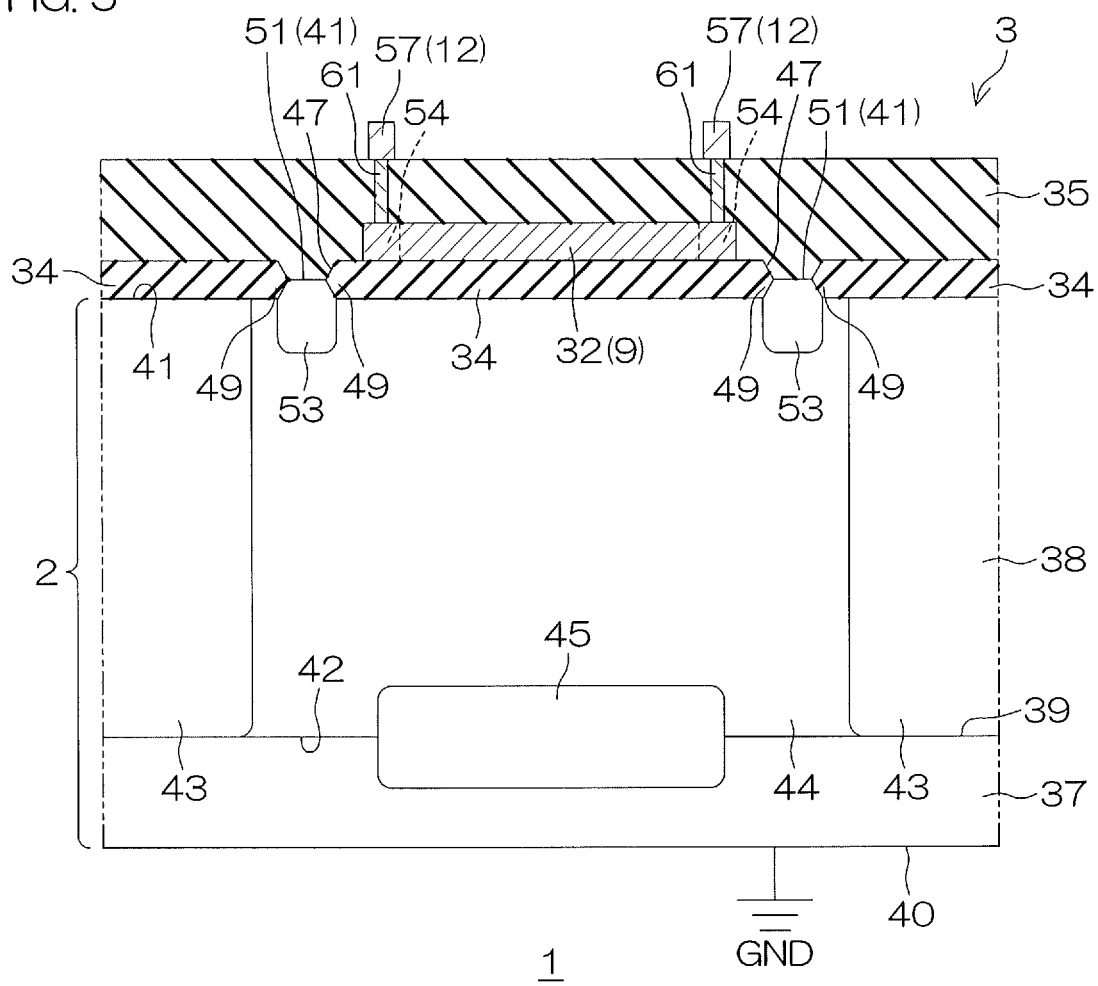
FIG. 5 is a cross-sectional view taken along line V-V in FIG. 3.
Figure 6:
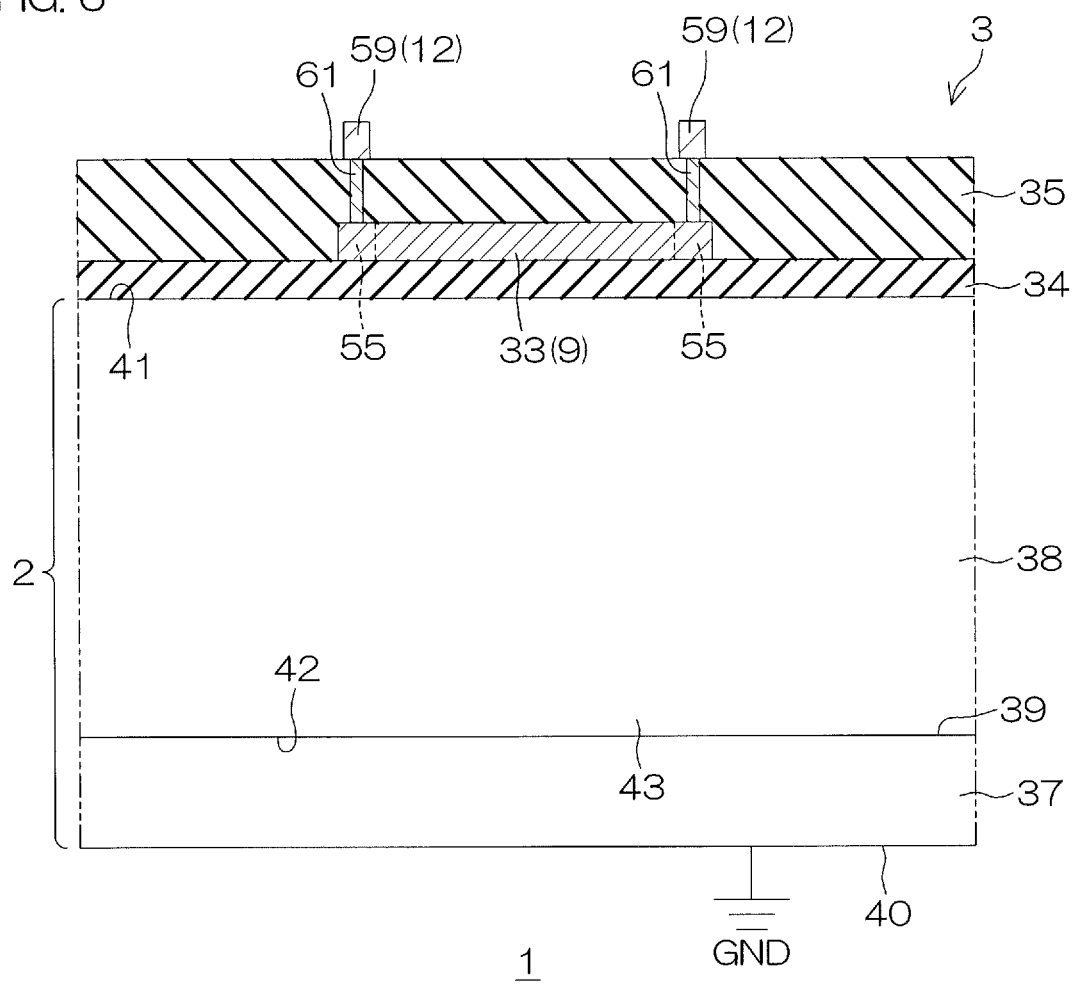
FIG. 6 is a cross-sectional view taken along line VI-VI in FIG. 3.
Figure 7A:
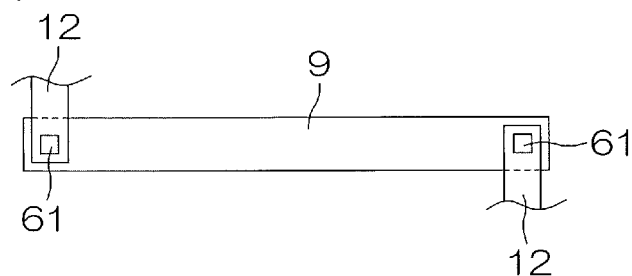
FIG. 7A to FIG. 7C are views for describing variations of planar shapes of each resistor.
Figure 7B:
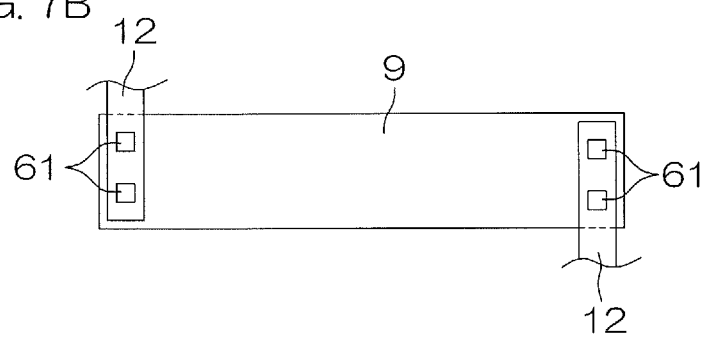
Figure 7C:
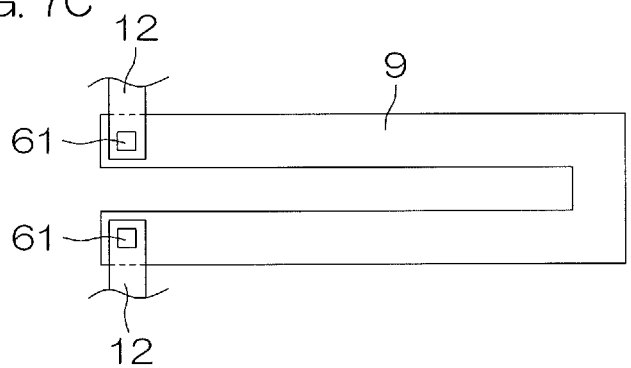

FIG. 3 is a schematic plan view of the resistance element 9 in FIG. 2. FIG. 4 is a cross-sectional view taken along line IV-IV in FIG. 3. FIG. 5 is a cross-sectional view taken alone IV-IV in FIG. 3. FIG. 6 is a cross-sectional view taken along line VI-VI in FIG. 3. FIG. 7A to FIG. 7C are views for describing variations of planar shapes of each resistance element 9.

Next, description will be given mainly of a detailed configuration of the resistance element 9 in FIG. 2.

As described above, the semiconductor device 1 includes the substrate 2, and further includes a field insulating film 34, the resistance element 9, an interlayer insulating film 35, the first wiring 12, and a via 36 as an example of a second wiring the present disclosure.

The substrate 2 includes a base substrate 37 and an epitaxial layer 38 formed on the base substrate 37.

The base substrate 37 has a front surface 39 and a back surface 40. The front surface 39 is a surface that is in contact with the epitaxial layer 38. The entire surface of the back surface 40 is exposed outside the semiconductor device 1.

The base substrate 37 is, in this preferred embodiment, formed with a silicon (Si) substrate, but may be a substrate formed with another material (for example, silicon carbide (SiC) or the like). The base substrate 37 is p type in this preferred embodiment. The base substrate 37 has an impurity concentration of, for example, $1\times10^{14}$ cm$^{-3}$ to $5\times10^{18}$ cm$^{-3}$. Further, the thickness of the base substrate 37 is, for example, 500 µm to 800 µm before grinding.

The epitaxial layer 38 is in contact with the base substrate 37 and is also laminated on the base substrate 37. The epitaxial layer 38 has a front surface 41 and a back surface 42. The front surface 41 is a surface on which various functional elements of the semiconductor device 1 are formed, and may be referred to as an element principal surface. The back surface 42 is a surface that is in contact with the front surface 39 of the base substrate 37.

The epitaxial layer 38 is, in this preferred embodiment, formed with the same material (silicon (Si)) as that of the base substrate 37. The epitaxial layer 38 has a conductivity type opposite to that of the base substrate 37, and type in this preferred embodiment. The epitaxial layer 38 has an impurity concentration of, for example, $5\times10^{14}$ cm$^{-3}$ to $1\times10^{17}$ cm$^{-3}$. Further, the thickness of the epitaxial layer 38 is, for example, 3 µm to 20 µm.

In the epitaxial layer 38, a p type element isolation well 43 as an example of a first region of the present disclosure is formed. The p type element isolation well 43 is formed so as to reach the base substrate 37 from the front surface 41 of the epitaxial layer 38. A bottom portion of the p type element isolation well 43 may be, as shown in FIG. 4 to FIG. 6, coincident with a depth position of the boundary between the base substrate 37 and the epitaxial layer 38, or may be positioned at a middle portion in the thickness direction of the base substrate 37. That is, the depth of the p type element isolation well 43 may be greater than the thickness of the epitaxial layer 38.

The part of the epitaxial layer 38 surrounded by the p type element isolation well 43 is an n type region 44 as an example of a second region of the present disclosure. The n type region 44 is demarcated at its side portion by the p type element isolation well 43 and demarcated at its bottom portion by the p type base substrate 37.

Although the illustration is omitted, an n type region similar to the n type region 44 may also be formed in another region of the first circuit 3 by being surrounded by the p type element isolation well 43. Moreover, the p-channel MOSFET 16 of the internal circuit 10 (CMOSFET) may be formed in the n type region, and the n-channel MOSFET 17 may be formed in the p type element isolation well 43 that is close to the p-channel MOSFET 16. Further, also in each of the second to fourth circuits 4 to 6, one or a plurality of n type regions surrounded by the p type element isolation well 43 may be formed, and functional elements constituting an LSI, such as a diode and a transistor, may be formed in the region(s).

In the n type region 44, at the boundary between the base substrate 37 and the epitaxial layer 38, an n type embedded region 45 is formed. The n type embedded region 45 is formed across the boundary between the base substrate 37 and the epitaxial layer 38. The n type embedded region 45 formed away inward from the boundary between the p type element isolation well 43 and the n type region 44 in a direction along the front surface 41 of the epitaxial layer 38. The n type embedded region 45 may have an n type impurity concentration exceeding the impurity concentration of the epitaxial layer 38. For example, the impurity concentration of the n type embedded region 45 may be $1\times10^{16}$ cm$^{-3}$ to $1\times10^{20}$ cm$^{-3}$.

The field insulating film 34 is formed on the front surface 41 of the epitaxial layer 38. The field insulating film 34 covers the p type element isolation well 43 and the n type region 44. The field insulating film 34 has a first opening 46 that exposes a portion of the p type element isolation well 43 and a second opening 47 that exposes a portion of the n type region 44. The second opening 47 is formed, for example, in an annular shape in a plan view.

The field insulating film 34 is, in this preferred embodiment, formed from silicon oxide (SiO$_2$), more specifically, formed from a LOCOS (LOCal Oxidation of Silicon) oxide film, but may be formed from another insulating material (for example, silicon nitride (SiN) or the like). Further, the field insulating film 34 may be formed with a plurality of materials, for example, a laminated structure of silicon oxide and silicon nitride.

Further, when the field insulating film 34 is formed with the LOCOS oxide film, it may be gradually reduced in thickness at peripheral edge portions of the first opening 46 and the second opening 47. The parts of the field insulating film 34 that are thus gradually changed in thickness may be referred to as a first bird's beak portion 48 surrounding the first opening 46 and a second bird's beak portion 49 surrounding the second opening 47. The front surface 41 (first front surface 50) of a part of the epitaxial layer 38 surrounded by the first bird's beak portion 48 and the front surface 41 (second front surface 51) of a part of the epitaxial layer 38 surrounded by the second bird's beak portion 49 are higher in position than the front surface 41 of another region of the epitaxial layer 38.

The p type element isolation well 43 includes a p$^+$ type contact portion 52 (first contact portion). The p$^+$ type contact portion 52 is formed on the front surface 41 of the epitaxial layer 38, and exposed from the first opening 46. The p$^+$ type contact portion 52 is formed with the first front surface 50 of the epitaxial layer 38 to a position deeper than bottom portion of the field insulating film 34 (front surface 41). Further, the p$^+$ type contact portion 52 is formed so as to be along (in contact with) the first bird's beak portion 48 of the field insulating film 34. Thereby, the p$^+$ type contact portion 52 is formed, for example, in a substantially bottle shape having a narrowed upper portion and a bulging lower portion in a cross-sectional view.

The p$^+$ type contact portion 52 may have a p type impurity concentration exceeding the impurity concentration of the p type element isolation well 43. For example, the impurity concentration of the p$^+$ type contact portion 52 may be $1\times10^{16}$ cm$^{-3}$ to $1\times10^{20}$ cm$^{-3}$.

The n type region 44 includes an n$^+$ type contact portion 53 (second contact portion). The n$^+$ type contact portion 53 is formed on the front surface 41 of the epitaxial layer 38, and exposed from the second opening 47. That is as shown in FIG. 3, the n$^+$ type contact portion 53 is formed in an annular shape in a plan view. Moreover, the n$^+$ type contact portion 53 is formed away inward from the boundary between the p type element isolation well 43 and the n type region 44.

The n$^+$ type contact portion 53 is formed from the second front surface 51 of the epitaxial layer 38 to a position deeper than the bottom portion of the field insulating film 34 (front surface 41). Further, the n$^+$ type contact portion 53 is formed so as to be along (in contact with) the second bird's beak portion 49 of the field insulating film 34. Thereby, the n$^+$ type contact portion 53 is formed, for example, in a substantially bottle shape having a narrowed upper portion and a bulging lower port ion in a cross-sectional view.

The n$^+$ type contact portion 53 may have an n type impurity concentration exceeding the impurity concentration of the type region 44. For example, the impurity concentration of the n⁺ type contact portion 53 may be $1\times10^{16}$ cm$^{-3}$ to $1\times10^{20}$ cm$^{-3}$.

The resistance element formed on the field insulating film 34. The resistance element 9 is, in this preferred embodiment, formed with a polysilicon resistor, and specifically, may be a polysicon resistor doped with p type impurities. The resistance element 9 may be formed with a material different from polysilicon as long as it is a material satisfying the function as a resistor.

The resistance element 9 includes the first resistor 32 and the second resistor 33, as described above.

The first resistor 32 is formed on a side closer to the first pad 7A than the second resistor 33, and faces the n type region 44 across the field insulating film 34. The first resistor 32 is formed in plural numbers. More specifically, as shown in FIG. 3, the plurality of first resistors 32 are arrayed in a striped pattern on the field insulating film 34. As shown in FIG. 5, at both end portions of each first resistor 32, first contact portions 54 duped with p type impurities at a high concentration are formed. Further, the plurality of first resistors 32 may be different from each other or may be the same in resistance value.

The second resistor 33 is formed on a side closer to the internal circuit 10 than the first resistor 32, and faces the p type element isolation well 43 across the field insulating film 34. The second resistor 33 is formed in plural numbers. More specifically, as shown in FIG. 3, the plurality of second resistors 33 are arrayed in a striped pattern on the field insulating film 34. As shown in FIG. 6, at both end portions of each second resistor 33, second contact portions 55 doped with p type impurities at a high concentration are formed. Further, the plurality of second resistors 33 may be different from each other or may be the same in resistance value. Further, the total resistance value of the second resistors 33 may be higher or lower than the total resistance value of the first resistors 32, but for the following reason, the first resistors 32 and the second resistors 33 are preferably the same in resistance value. For example, an element-ice wiring 60 is fixed to a potential close to a ground potential by the protection diode 25. Because a connection wiring 58 faces both the n type region 44 close to a terminal potential and the p type element isolation well 43 close to the ground potential across the field insulating film 34, it is preferable, for equalizing voltages to be applied to their respective corresponding parts of the field insulating film 34, that the connection wiring 58 is at an intermediate potential between the terminal potential and the ground potential. Accordingly, the first resistors 32 and the second resistors 33 are preferably the same in resistance value.

Further, each resistance element 9 may be formed in a linear shape as shown in FIG. 7A or FIG. 7B, or may be formed in a curved shape as shown in FIG. 7C. As in FIG. 7B, in the case of a relatively wide resistance element 9, a plurality of vias 61 (described later) may be connected to each end portion of the resistance element 9.

The interlayer insulating film 35 is formed on the substrate 2 so as to cover the resistance element 9. The interlayer insulating film 35 is, in this preferred embodiment, formed from silicon oxide ($SiO_2$), but may be formed from another insulating material (for example, silicon nitride (SiN) or the like).

The first wiring 12 is formed on the interlayer insulating film 35. The first wiring 12 is formed with aluminum (Al) in this preferred embodiment. The first wiring 12 connects the plurality of first resistors 32 and the plurality of second resistors 33 in series.

The first wiring 12 can be distinguished for each connection target. For example, the first wiring 12 may include a terminal-side wiring 56, a first wiring 57, the connection wiring 58, a second wiring 59, and the element-side wiring 60 in order from the upstream side toward the downstream side (from the first pad 7A toward the internal circuit 10).

The terminal-side wiring 56 may be a wiring extending from the resistance element 9 to the first pad 7A. The terminal-side wiring 56 is connected to an end portion of the first resistor 32 on the side closest to the first pad 7A out of the first resistors 32.

The first wiring 57 may be a wiring connecting the plurality of first resistors 32 in series of in parallel with each other. The first wiring 57 may be referred to as a first series wiring when it connects the plurality of first resistors 32 in series to each other, and may be referred to as a first parallel wiring when it connects the plurality of first resistors 32 in parallel with each other. The first wiring 57 alternately connects one end portions and the other end portions of the plurality of first resistors 32 having the striped pattern to each other, and thereby, as shown in FIG. 3, the wiring route including the first wiring 57 and the first resistors 32 is formed in a zigzag pattern in a plan view.

The connection wiring 58 may be a wiring connecting the first resistor 32 and the second resistor 33. The connection wiring 58 straddles between the n type region 44 and the p type element isolation well 43. In other words, the connection wiring 58 crosses the boundary between the n type region 44 and the p type element isolation well 43 above the substrate 2.

The second wiring 59 may be a wiring connecting the plurality of second resistors 33 in series or in parallel with each other. The second wiring 59 may be referred to as a second series wiring when it connects the plurality of second resistors 33 in series to each other, and may be referred to as a second parallel wiring when it connects the plurality of second resistors 33 in parallel with each other. The second wiring 59 alternately connects one end portions and the other end portions of the plurality of second resistors 33 having the striped pattern to each other, and thereby, as shown in FIG. 3, the wiring route including the second wiring 59 and the second resistors 33 is formed in a zigzag pattern in a plan view.

The element-side wiring 60 may be a wiring extending from the resistance element 9 to the internal circuit 10. The element-side wiring 60 is connected to an end portion of the second resistor 33 on the side closest to the internal circuit 10 out of the second resistors 33.

Each of the wirings 56 to 60 and the resistance 9 (first resistor 32 and second resistor 3) are connected by the vias 61. The vias 61 extend through the interlayer insulating film 35 in the thickness direction, and connect each of the wirings 56 to 60 and the resistance element 9. The vias 61 are, in this preferred embodiment, formed with tungsten (W), but may be formed with another conductive material (for example, aluminum (Al), copper (Cu), or the like). Further, with respect to the resistance element 9, the vias 61 are connected to the first contact portions 54 of the first resistor 32 and the second contact portions 55 of the second resistor 33.

The via 36 connects the first wiring 12 and the n type region 44. The via 36 is connected to the first wiring 12 on a side closer to the first pad 7A than the resistance element 9. More specifically, the via 36 extends from the terminal-side wiring 56 through the interlayer insulating film 35 in the thickness direction, and is connected to the n⁺ type contact portion 53. The via 36 is, in this preferred embodiment, formed with tungsten (W), but may be formed with another conductive material (for example, aluminum (Al), copper (Cu), or the like).

The semiconductor device 1 further includes a via 62 that connects the ground wiring 13 and the p type element isolation well 43. More specifically, the via 62 extends from the ground wiring 13 through the interlayer insulating film 35 in the thickness direction, and is connected to the $p^+$ type contact portion 52. Thereby, the p type element isolation well 43 and the base substrate 37 are connected to the ground potential. The via 62 is, in this preferred embodiment, formed with tungsten (W), but may be formed with another conductive material (for example, aluminum (Al), copper (Cu), or the like).

Note that the vias 36, 61, 62 are each referred to as a "via" from the viewpoint of being members that penetrate through the interlayer insulating film 35 in the thickness direction, however, they may be each referred to as a "wiring" or a "connecting member" from the viewpoint of connecting different conductive members.

Moreover, on the interlayer insulating film 35, a multi-layer wiring structure including interlayer insulating films and wiring may be further formed, or the surface protective film 8 may be directly formed.

As above, according to the semiconductor device 1, the first wiring 12 is electrically branched on the side closer to the first pad 7A than the resistance element 9, and is connected to the n type region 44 via the via 36 (second wiring). Thereby, when the first pad 7 is applied with voltage, a potential difference between the first resistor 32 and the n type region 44 facing across the field insulating film 34 can be made small. In other words, although a slight error caused by a voltage drop due to wiring resistance and the like of the first wiring 12 and the via 36 is expected, the first resistor 32 and the n type region 44 can be made almost the same in potential.

Conversely, when the resistance element 9 faces in its entirety a region with the ground potential such as the p type element isolation well 43, a potential difference between the resistance element 9 and the p type element isolation well 43 serves as a voltage value of the resistance element 9 with respect to the ground potential. Therefore, when a relatively high voltage (for example, a voltage exceeding 1000 V caused by static electricity or the like) is applied to the first pad 7A, a large voltage is applied to the field insulating film 34 between the resistance element 9 and the p type element isolation well 43, which increases the possibility of dielectric breakdown of the field insulating film 34.

In contrast, with a configuration in which the first resistor 32 faces the n type region 44 (terminal potential or potential substantially the same as terminal potential), the voltage be applied to the field insulating film 34 can be reduced from the configuration in which the entirety of the resistance element 9 faces the p type element isolation well 43 (ground potential). As a result, the possibility of dielectric breakdown of the field insulating film 34 can be lowered, so that the semiconductor device 1 can be increased in reliability.

Furthermore, the first resistor 32 is formed in plural numbers so as to be connected in series or in parallel with each other. Therefore, a voltage to be applied to the plurality of first resistors 32 as a whole can be dispersed to each of the first resistors 32, so that the amount of heat generation in each of the first resistors 32 can be made small. As a result, a temperature rise from the first resistors 32 can be suppressed, and the reliability of the semiconductor device 1 can be increased. This is effective because the first resistors 32 are covered with the interlayer insulating film 35 and heat is easily filled between the field insulating film 34 and the interlayer insulating film 35.

Further, in the semiconductor device 1, the second resistors 33 are provided in addition to the first resistors 32. The potential of an end portion of the plurality of first resistors 32 on the internal circuit side 10 has been made lower than the terminal potential by a voltage drop due to the plurality of first resistors 32, and is closer to the ground potential. Here, a first potential difference between the potential (terminal potential or potential substantially the same as terminal potential) of the n type region 44 and the potential of an end portion of the first resistor 32 on the internal circuit side 10 (in FIG. 3, the topmost first resistor 32 on the page out of the four first resistors 32) is compared with a second potential difference between the potential of the end portion and the potential (ground potential) of the p type element isolation well 43. In this case, if the second potential difference is smaller than the first potential difference (second potential difference<first potential difference), by providing the second resistor 33 at a position to face the p type element isolation well 43, the possibility of dielectric breakdown of the field insulating film 34 on the downstream side from the first resistors 32 (the internal circuit 10 side) can be further lowered.

While preferred embodiments of the present disclosure have been described above, the present disclosure may be implemented in other modes.

Figure 8:
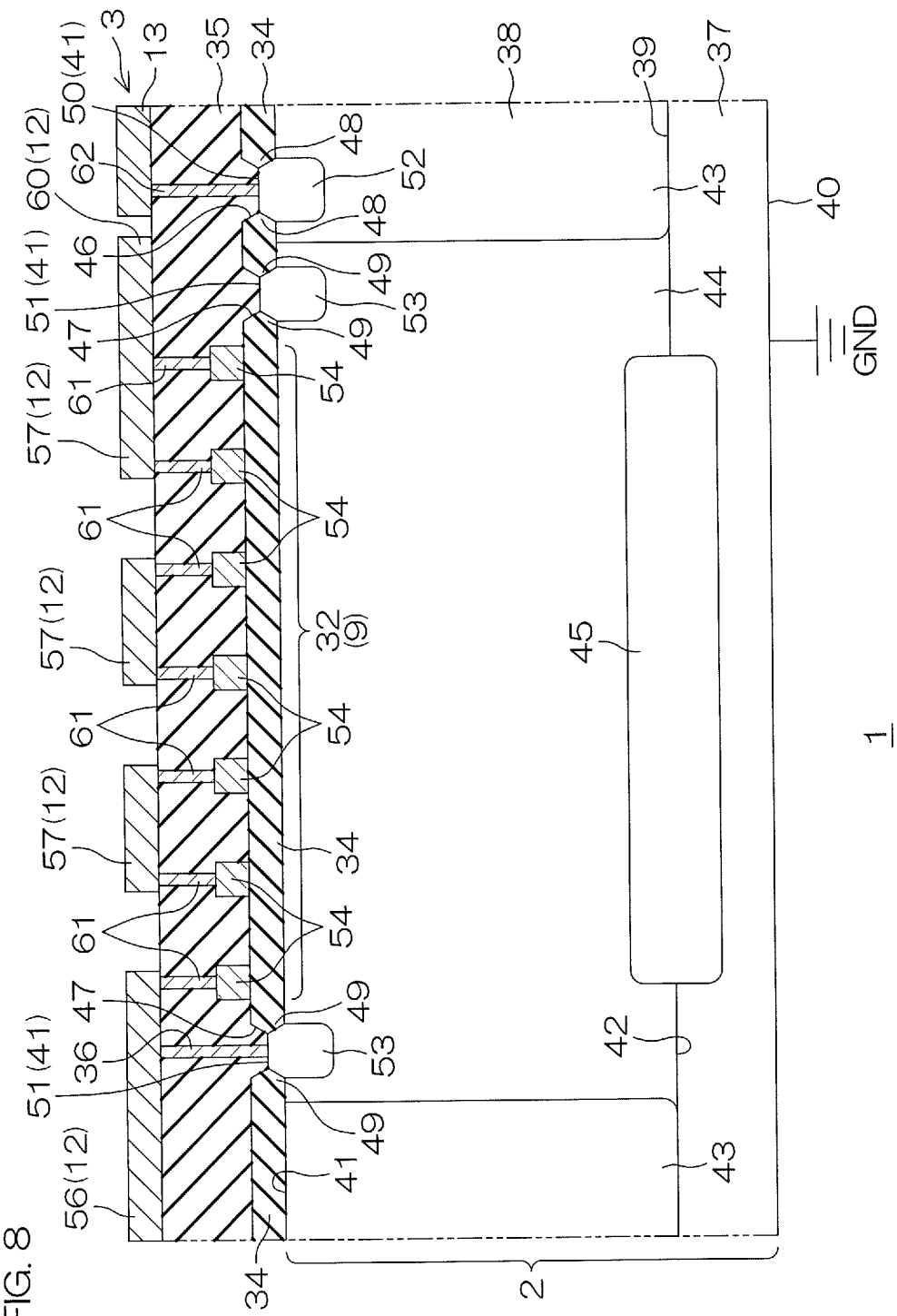
FIG. 8 is a view showing a modification example of the resistance element.

For example, as shown in FIG. 8, the resistance element 9 may be made only with the first resistor 32. That is, the entirety of the resistance element 9 may face the n type region 44 across the field insulating film 34.

Further, in the embodiment described above, the first wiring 12 is positioned on the interlayer insulating film 35 covering the resistance element 9. However, the wiring 12 is not limited to this position. For example, when a multilayer wiring structure is further formed on the interlayer insulating film 35, the first wiring 12 may be formed on any of the interlayer insulating films of the multilayer wiring structure.

Further, between the resistance element 9 and the substrate 2, only the field insulating film 34 may be interposed as described above, or another insulating film may be interposed besides the field insulating film 34.

Further, the internal circuit 10 may be, for example, an output circuit of a CMOS inverter as in FIG. 2 an output circuit of a CMOS inverter, or an input circuit of a differential amplifier using a bipolar transistor, or the like.

Besides the above, various design changes can be applied within the scope of matters described in the claims.

The present application corresponds to Japanese Patent Application No. 2020-069913 filed on Apr. 8, 2020 with the Japan Patent Office, and the entire disclosure of this application is incorporated herein by reference.

REFERENCE SIGNS LIST

1: semiconductor device
2: substrate
7: pad
7A: first pad
7B: second pad
9: resistance element
10: internal circuit
12: first wiring
13: ground wiring
23: protection element
24: protection transistor 25: protection diode
30: connection portion
32: first resistor
33: second resistor
34: field insulating film
36: via
37: base substrate
38: epitaxial layer
43: p type element, isolation well
44: n type region

The invention claimed is:

1. A semiconductor device comprising:
a semiconductor layer;
a first region of a first conductivity type formed in the semiconductor layer and connected to a ground potential;
a second region of a second conductivity type formed in the semiconductor layer;
an insulating film formed on the semiconductor layer and covering the first region and the second region;
an internal circuit;
a signal terminal for driving the internal circuit or to be driven by the internal circuit;
a first wiring connecting the internal circuit and the signal terminal;
a resistance element formed on the insulating film and interposed halfway through the first wiring, the resistance element including a first resistor facing the second region across the insulating film; and
a second wiring connected to the first wiring on a side closer to the signal terminal than the resistance element and connecting the first wiring and the second region.

2. The semiconductor device according to claim 1, wherein the first resistor includes a plurality of first resistors connected in series or in parallel with each other.

3. The semiconductor device according to claim 2, wherein the resistance element includes a second resistor formed on a side closer to the internal circuit than the plurality of first resistors and facing the first region across the insulating film.

4. The semiconductor device according to claim 1, further comprising: a ground terminal for providing the ground potential; and
a ground wiring connected to the ground terminal.

5. The semiconductor device according to claim 4, wherein the signal terminal includes a first pad formed on a front surface of the semiconductor device, and
the ground terminal includes a second pad formed on the front surface of the semiconductor device.

6. The semiconductor device according to claim 4, further comprising a protection element connected between the first wiring and the ground wiring.

7. The semiconductor device according to claim 6, wherein the protection element includes a first protection element connected to the first wiring on a side closer to the signal terminal than a connection portion between the first wiring and the second wiring.

8. The semiconductor device according to claim 7, wherein the protection element includes a second protection element connected to the first wiring on a side closer to the internal circuit than the resistance element.

9. The semiconductor device according to claim 1, wherein the resistance element includes a polysilicon resistor.

10. The semiconductor device according to claim 1, wherein the insulating film includes an oxide film.

11. The semiconductor device according to claim 1, wherein the second wiring includes a via connected to the second region that penetrates through the insulating film in a thickness direction.

12. The semiconductor device according to claim 1, wherein the semiconductor layer includes a substrate of the first conductivity type and an epitaxial layer formed on the substrate, and
the first region and the second region are formed in the epitaxial layer.

* * * * *